(12) United States Patent
Larsson et al.

(10) Patent No.: US 10,941,303 B2
(45) Date of Patent: Mar. 9, 2021

(54) CHEMICAL CONVERSION OF YTTRIA INTO YTTRIUM FLUORIDE AND YTTRIUM OXYFLUORIDE TO DEVELOP PRE-SEASONED COROSSION RESISTIVE COATING FOR PLASMA COMPONENTS

(71) Applicant: Applied Materials, Inc., Santa Clara, CA (US)

(72) Inventors: Mats Larsson, Sunnyvale, CA (US); Yogita Pareek, San Jose, CA (US); Jianqi Wang, Fremont, CA (US); Kevin A. Papke, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 509 days.

(21) Appl. No.: 15/784,058

(22) Filed: Oct. 13, 2017

(65) Prior Publication Data

US 2018/0105701 A1   Apr. 19, 2018

Related U.S. Application Data

(60) Provisional application No. 62/407,792, filed on Oct. 13, 2016.

(51) Int. Cl.
| | | |
|---|---|---|
| *B32B 9/00* | (2006.01) | |
| *C09D 5/08* | (2006.01) | |
| *H01L 21/683* | (2006.01) | |
| *B05D 1/18* | (2006.01) | |
| *C09D 1/00* | (2006.01) | |

(Continued)

(52) U.S. Cl.
CPC .............. *C09D 5/08* (2013.01); *B05D 1/18* (2013.01); *C09D 1/00* (2013.01); *H01J 37/32495* (2013.01); *H01L 21/67069* (2013.01); *H01L 21/6831* (2013.01); *H01J 2237/334* (2013.01)

(58) Field of Classification Search
None
See application file for complete search history.

(56) References Cited

U.S. PATENT DOCUMENTS

| | | |
|---|---|---|
| 4,430,169 A | 2/1984 | Woods |
| 7,037,846 B2 | 5/2006 | Srivastava et al. |

(Continued)

FOREIGN PATENT DOCUMENTS

| | | |
|---|---|---|
| CN | 103959447 A | 7/2014 |
| CN | 105190847 A | 12/2015 |

(Continued)

OTHER PUBLICATIONS

Office Action for Chinese Patent Application No. 201721314021.6 dated Mar. 7, 2018.

(Continued)

*Primary Examiner* — Humera N. Sheikh
*Assistant Examiner* — Mary I Omori
(74) *Attorney, Agent, or Firm* — Patterson + Sheridan, LLP

(57) ABSTRACT

Embodiments of the disclosure provide a chamber component for use in a plasma processing chamber apparatus. The chamber component may include a coating layer that provides a fluorine-rich surface. In one embodiment, a chamber component, for use in a plasma processing apparatus, includes a body having an outer layer comprising yttria having a coating layer formed thereon, wherein the coating layer comprises a yttrium fluoride containing material.

20 Claims, 4 Drawing Sheets

(51) Int. Cl.
*H01J 37/32* (2006.01)
*H01L 21/67* (2006.01)

(56) References Cited

U.S. PATENT DOCUMENTS

| | | | |
|---|---|---|---|
| 8,349,128 B2 | 1/2013 | Todorow et al. | |
| 8,535,443 B2 | 9/2013 | Lee et al. | |
| 8,801,896 B2 | 8/2014 | Todorow et al. | |
| 2001/0006070 A1 | 7/2001 | Shang et al. | |
| 2003/0141017 A1 | 7/2003 | Fujisato | |
| 2004/0216667 A1* | 11/2004 | Mitsuhashi | C23C 16/4404 118/715 |
| 2005/0178664 A1 | 8/2005 | Ostrovsky | |
| 2008/0241517 A1 | 10/2008 | Kenworthy et al. | |
| 2009/0038946 A1 | 2/2009 | Ohmi et al. | |
| 2009/0142588 A1 | 6/2009 | Ohmi et al. | |
| 2009/0250351 A1 | 10/2009 | Ostrovsky | |
| 2013/0162142 A1* | 6/2013 | Nishino | H05H 1/46 315/111.21 |
| 2014/0272459 A1 | 9/2014 | Daugherty et al. | |
| 2014/0345803 A1 | 11/2014 | Todorow et al. | |
| 2016/0076129 A1* | 3/2016 | Nagayama | C23C 4/06 427/448 |
| 2016/0254125 A1* | 9/2016 | Huang | C23C 4/11 29/458 |
| 2016/0258064 A1* | 9/2016 | Pareek | C23C 16/4581 |
| 2016/0273095 A1* | 9/2016 | Lin | C23C 14/5806 |
| 2016/0307740 A1* | 10/2016 | Kim | H01L 21/6719 |
| 2016/0326059 A1* | 11/2016 | Nagayama | C04B 35/505 |
| 2017/0040146 A1* | 2/2017 | Huang | H01J 37/32715 |
| 2017/0140902 A1* | 5/2017 | Simpson | C04B 35/581 |
| 2017/0282221 A1* | 10/2017 | Lee | B08B 3/12 |
| 2017/0342539 A1* | 11/2017 | Sato | C23C 14/06 |

FOREIGN PATENT DOCUMENTS

| | | |
|---|---|---|
| CN | 105428195 A | 3/2016 |
| TW | 201634665 A | 10/2016 |
| TW | M563652 U | 7/2018 |

OTHER PUBLICATIONS

Office Action from Chinese Patent Application No. 201721314021.6 dated Jun. 15, 2018.

Office Action from Taiwan Patent Application No. 106133072 dated Mar. 13, 2020.

Office Action from Taiwan Patent Application No. 106133072 dated Aug. 31, 2020.

* cited by examiner

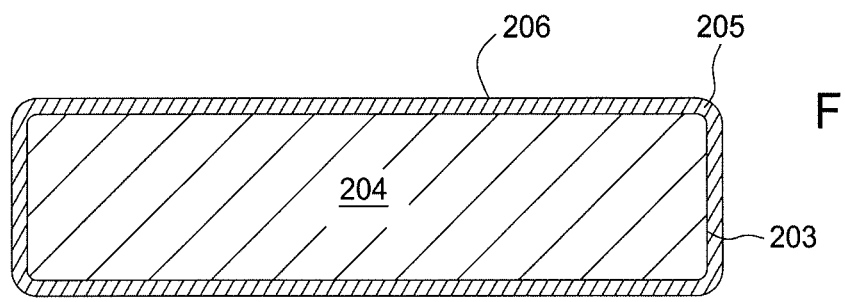
FIG. 2A
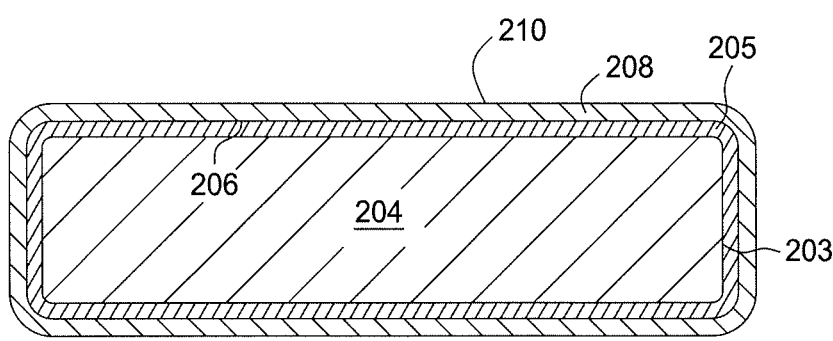
FIG. 2B
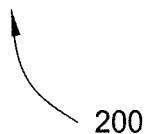

CHEMICAL CONVERSION OF YTTRIA INTO YTTRIUM FLUORIDE AND YTTRIUM OXYFLUORIDE TO DEVELOP PRE-SEASONED COROSSION RESISTIVE COATING FOR PLASMA COMPONENTS

CROSS-REFERENCE TO RELATED APPLICATION

This application claims benefit of U.S. Provisional Application Ser. No. 62/407,792 filed Oct. 13, 2016, which is incorporated by reference in its entirety.

FIELD

Embodiments disclosed herein generally relate to manufacturing a coating/barrier/passivation layer on a processing chamber component resistive to the corrosive plasma environment utilized in a semiconductor plasma processing chamber. More specifically, embodiments disclosed herein relate to form a fluorine containing layer on a yttria containing structure utilized in plasma equipment components for reduction of particles and stabilization of etch rates and plasma processing conditions in a semiconductor plasma processing chamber.

DESCRIPTION OF THE PRIOR ART

Semiconductor processing involves a number of different chemical and physical processes whereby minute integrated circuits are created on a substrate. Layers of materials which make up the integrated circuit are created by chemical vapor deposition, physical vapor deposition, epitaxial growth, chemical treatment, electrochemical processes and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. During plasma processing, the energized gas is often comprised of ions, radicals and highly reactive species which etches and erodes exposed portions of the processing chamber components, for example, an electrostatic chuck that holds the substrate during processing. Continuous attack from the reactive species during the plasma processing process may result in process drift due to the composition (or element) change of the chamber components. Additionally, processing by-products are often deposited on chamber components which must be periodically cleaned typically with highly reactive fluorine. Attack from the reactive species during processing and cleaning often causes the chemical composition of the chamber components to be unstable, as well as reduces the lifespan of the chamber components and increase service frequency.

Additionally, flakes from the eroded parts of the chamber component may become a source of particulate contamination during substrate processing. As such, the chamber components must be replaced after a number of process cycles and before they provide inconsistent or undesirable properties during substrate processing. Therefore, promoting plasma resistance and quality stability of chamber components is desirable to increase service life of the processing chamber, reduce chamber downtime, reduce maintenance frequency, and improve product yields.

Therefore, there is a need for an improved method for forming chamber components with a robust coating.

SUMMARY

Embodiments of the disclosure provide a chamber component for use in a plasma processing chamber apparatus. The chamber component may include a coating layer that provides a fluorine-rich surface. In one embodiment, a chamber component, for use in a plasma processing apparatus, includes a body having an outer layer comprising yttria having a coating layer formed thereon, wherein the coating layer comprises a yttrium fluoride containing material.

In another embodiment of the disclosure, an apparatus for use in a plasma processing chamber having a chamber component disposed therein includes a chamber component disposed in a plasma processing chamber, wherein the chamber component comprises a body having an outer layer comprising yttria, and a coating layer formed on the body, wherein the coating layer comprises a yttrium fluoride containing material.

In yet another embodiment of the disclosure, a method for fabricating a chamber component for use in a plasma processing environment includes immersing a body of a chamber component having an outer layer formed from yttria into an wet coating solution including at least one ammonium salt and HF, reacting fluorine ions from the wet coating solution with yttria from the chamber component, and forming a coating layer that comprises a yttrium oxyfluoride containing material.

BRIEF DESCRIPTION OF THE APPENDED DRAWINGS

The teachings of the present disclosure can be readily understood by considering the following detailed description in conjunction with the accompanying drawings, in which:

FIGS. 2A-2B depict different manufacturing stages of a chamber component undergoing the wet coating process of FIG. 1;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

According to one embodiment of the disclosure, a chamber component is provided that includes a body comprising yttria ($Y_2O_3$) having a coating layer comprising a fluorine-rich surface formed thereon for use in plasma processing equipment. In one example, the coating layer may be formed using a wet coating process that includes fluorine ion containing solution. Examples of solutions that may be utilized to form the coating layer may include a fluorine containing chemical and ammonium salt that substantially maintain the wet coating solution at a desired pH level and stable ion concentration during the coating process.

In one embodiment, the coating layer formed on the chamber component may have a thickness between about 10 nm and about 80 nm. The coating layer maybe amorphous in nature. Surface morphology, corrosion resistance and crystal structure of the coating layer may be formed by bathing the chamber component in a solution comprising fluorine containing chemical and ammonium salt at a solution temperature between at 10° C. and 100° C., such as around room temperature. The surface morphology of coating layer may be inspected by scanning Electron microscope (SEM), transmission electron microscopy (TEM), and Laser Microscopy. Compactness of the coating layer was inspected by detecting the mechanical behavior of the coating layer, density and resistivity was measured in different corrosive environments. Chemical compositions of the coating layer may be investigated by XPS and/or EDS.

Figure 1:
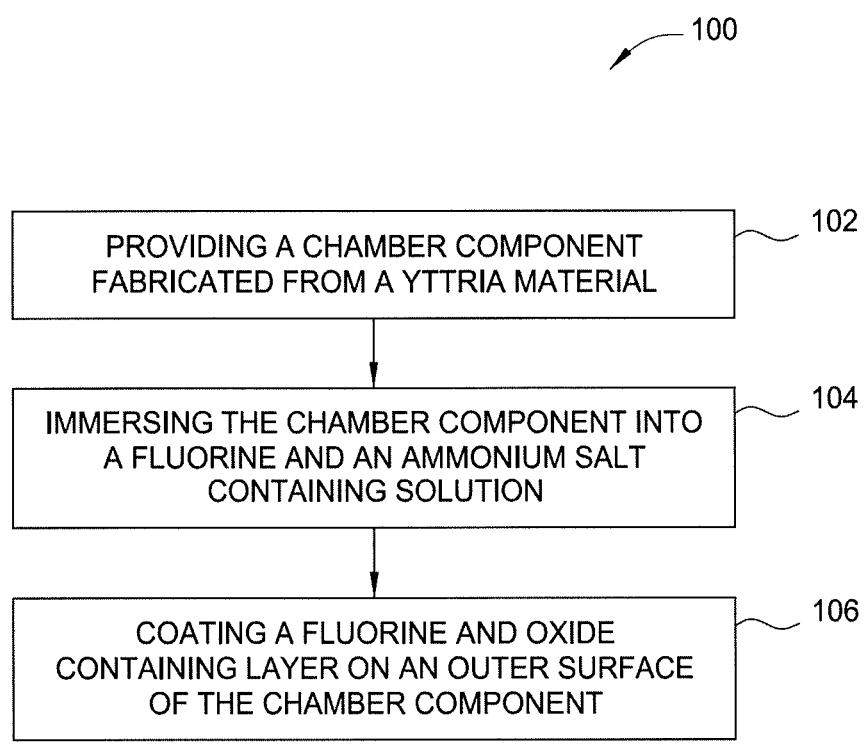
FIG. 1 depicts a flow diagram of one embodiment of a method for fabricating a coating layer on a chamber component.

FIG. 1 depicts a flow diagram of one embodiment of a method 100 that may be used to fabricate a chamber component 200. FIGS. 2A-2B depict different manufacturing stages of the chamber component 200. As mentioned above, the method 100 may readily be adapted for any suitable chamber component, including a substrate support assembly, a showerhead, a nozzle, chamber walls, chamber liner and a plasma screen, among others.

The method 100 begins at operation 102 by providing a chamber component 200 having a body 204 with an outer layer 205 made out of yttria ($Y_2O_3$), as shown in FIG. 2A, formed on an outer surface 203 of the body 204. The body 204 may be made by any suitable material as needed, such as aluminum containing materials or yttria or yttrium containing materials. In the embodiment wherein the outer layer 205 is not present, the body 204 of the chamber component 200 may be made from yttria or yttrium containing materials as needed.

In one embodiment, the outer layer 205 made of a rare earth material, such as a yttrium containing material including yttria ($Y_2O_3$), bulk yttrium (Y) or other yttrium containing material. Conventional yttria ($Y_2O_3$) utilized to form the outer layer 205 may have unreliable quality and inconsistent surface features that may lead to the formation of cracks and crazes on an outer surface 206 of the outer layer 205 after the chamber component 200 has been exposed to a plasma environment. As such, further processing or surface finish, as described in detail below, is desirable to create a robust, plasma resistant chamber component with desired surface protection.

Figure 3:
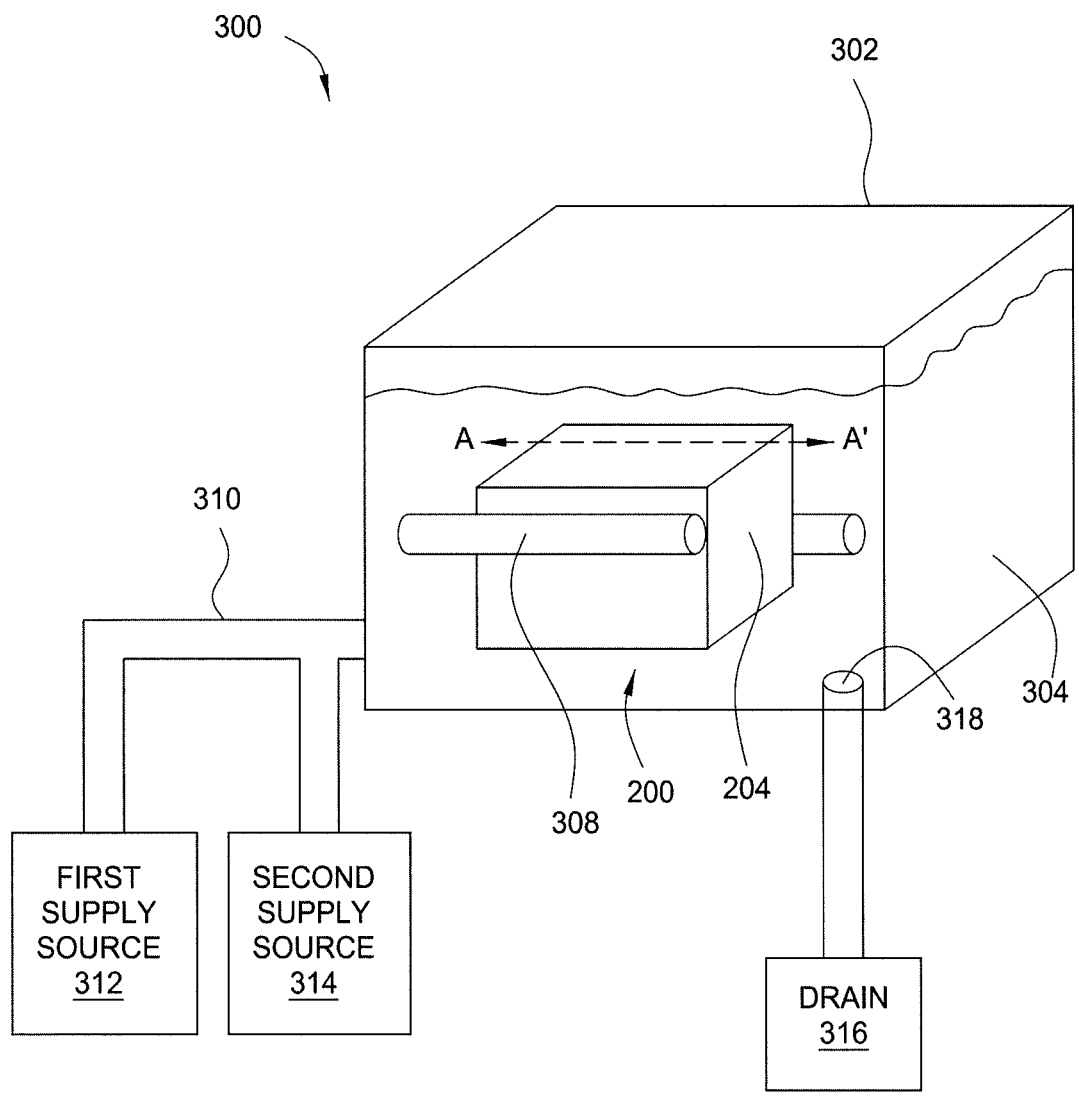
FIG. 3 is a schematic cross-sectional view of a wet process tool that may be used to apply a coating layer according to one embodiment of the disclosure depicted in FIG. 1.

At operation 104, the chamber component 200 is immersed into a wet coating solution 304 present in a wet processing tool 300, as shown in FIG. 3, that includes at least one fluorine containing chemical and/or ammonium salt dissolved in the wet coating solution 304. The wet coating solution 304 also comprises deionized (DI) water ($H_2O$). The wet coating solution 304 is an aqueous solution that contains at least one fluorine containing chemical and one ammonium salt having a concentration of between about 1 mM and about 4 mM in deionized (DI) water ($H_2O$) of about 100-400 μM. Suitable examples of the fluorine containing chemical include HF, buffered HF (BOE), ammonium fluoride, ammonium bifluoride and the like.

The fluorine containing chemical included in the wet coating solution 304 is configured to provide a suitable amount of fluorine ions ($F^-$), e.g., at a desired predetermine concentration, to react with the yttrium (Y) elements from the outer layer 205 comprising yttria ($Y_2O_3$), bulk yttrium (Y) or yttrium containing materials, thus doping/incorporating fluorine elements into the outer layer 205 of the chamber components, forming a coating layer 208 on the outer surface 206 of the outer layer 205. The fluorine ions from the fluorine containing chemical react with the yttrium (Y) elements from the outer layer 205, forming the coating layer 208 comprising yttrium-fluoride ($YF_3$) or yttrium-oxy-fluoride (YOF) on the outer surface 206 of the outer layer 205, as shown in FIG. 2B. Thus, the coated chamber component 200 has a fluorine-rich outer surface. In one particular example, the fluorine containing chemical used in the wet coating solution 304 is HF.

In another example, the ammonium salt is also utilized in the wet coating solution 304. Suitable examples of the ammonium salt include ammonium fluoride ($NH_4F$), ammonium chloride ($NH_4Cl$), ammonium nitrate ($NH_4NO_3$), ammonium hydrogen difluoride or ammonium bifluoride ($NH_4HF_2$), ammonium tetrafluoroborate ($NH_4BF_4$), ammonium hexafluorosilicate (($NH_4)_2SiF_6$) and the like. For ammonium salts which provides fluorine ions, such as ammonium fluoride ($NH_4$)F, such ammonium salts may also provide additional fluorine ions to react with the yttrium (Y) elements from the outer layer 205, forming the coating layer 208 comprising yttrium-fluoride ($YF_3$) or yttrium-oxy-fluoride (YOF) to provide the fluorine-rich surface. Additionally, such ammonium salt may also include $H^+$ so that the wet coating solution 304 with such aluminum salts disposed therein may maintain a desired pH level, such as a pH value of between about 2 and 6, to facilitate the coating process. It is believed either overly acidic or overly basic wet coating solution 304 may adversely attack the structure of the resultant coating layer 208 formed on the outer layer 205, resulting in high porosity of the coating layer 208 as well as poor surface finish, e.g., pits or cracks resulted in its outer surface 210.

In one example, different compounds may provide different pH levels for a given concentration. Thus, one or more pH adjusting agents or buffer agents or solvents may be utilized to maintain a desired level of pH value and assist dissociation of the chemical compounds dissolved in the wet coating solution 304. Suitable examples of the solvents include ethylene glycol, toluene, pyridine and the like. In some examples, some oxidizer, such as $HNO_3$, $H_2O_2$ and the like may also be utilized to assist chemical reaction in the wet coating solution 304 during the coating process.

In one example, the wet coating solution 304 includes HF, $NH_4F$, ethylene glycol dissolved in deionized (DI) water or water including $H_2O_2$. In such example, the wet coating solution 304 may include HF (with 49 volumetric percent in DI water) between about 10 ml and about 50 ml, such as about 30 ml, dissolved in DI water of about 100 ml, $NH_4F$ of between about 1 grams and about 5 grams, such as 2 grams, and ethylene glycol of between about 160 ml and about 200 ml, such as about 180 ml. The wet coating solution 304 may have a solution temperature from lower to high such as between at 10° C. and 100° C. The chamber component 200 may be immersed in the wet coating solution for a time period between about 2 hours and about 12 hours, such as between about 7 and about 8 hours, to form the coating layer 208.

The wet coating solution 304 may be provided in a tank, a sink, a bath, or other suitable container, such as a tank 302 depicted in FIG. 3, as needed. During the coating process, the wet coating solution 304 may be agitated, stirred or circulated as needed to improve coating uniformity. Also, a mega-sonic or ultrasonic power may be applied to the wet coating solution 304 as needed to improve coating efficiency.

An optional cleaning operation using isopropyl alcohol, acetone and the like can be included at the end of wet coating process at operation 104 in order to remove excess organic solvents from chamber component 200. This operation can be included to ensure no carbon contamination coming on surface due to solvent being used in wet chemistry.

At operation 106, after immersing the chamber component 200 in the wet coating solution 304, the coating layer 208 is formed on the surface 206 of the outer layer 205. The chamber component 200 with the coating layer 208 has at least one exposed surface 210 that is intended to be exposed to the plasma environment within a processing chamber when in use. Since the coating layer 208 is formed by immersing the chamber component 200, the coating layer 208 is beneficially conformal with the outer surface 206 of the outer layer 205. The coating layer 208 comprises yttrium-fluoride ($YF_3$) or yttrium-oxy-fluoride (YOF) formed on the outer layer 205 comprising yttrium (Y) containing and/or bulk yttrium (Y) or yttria ($Y_2O_3$) or other suitable yttrium containing materials.

It is noted that the coating layer 208 fills and bridges imperfections along the outer surface 206 of the outer layer 205, while producing a smooth and crack-free outer surface 210. Thus, by forming such coating layer 208 on the outer layer 205, the element composition ratios of each element (such as Y, O, N or C) in the outer layer 205 may be saturated by incorporating the elements from the wet coating solution 304. The dangling bonds from the outer surface 206 of the outer layer 205 may be repaired, reacted and saturated by the elements provided from the wet coating solution 304 so that the chamber component 200 is maintained in a stable condition that is more plasma resistive and inert against the reactive species present in the plasma during an etching process.

Since the outer surface 206 on which the coating layer 208 is formed as substantially defect free, high density and compactness, there are no initiation sites for cracks to form and propagate through the coating layer 208, resulting in a relatively smooth and defect-free outer surface 206 with minimum porosity.

In one example, the coating layer 208 covers and encapsulates the outer layer 205 and forms the outer surface 210 that is exposed to the plasma environment of a processing chamber. The coating layer 208 generally resists the corrosive elements found within the process volume and protects the chamber component from decay and wear.

After the wet coating process, the coating layer 208 with desired film properties and thickness is then formed on the outer surface 206 of the outer layer 205, forming the desired chamber component 200 with robust coating. The coating layer 208 protects the underlying metal (e.g., yttria) of the chamber component 200 from the corrosive process environment within a plasma processing chamber. The coating layer 208 has a thickness sufficient to adequate protection from the process environment, yet is not so thick as to aggravate surface cracks and crazes. In one specific example, the coating layer 208 has a thickness of less than 1 µm, such as between about 10 nm and about 80 nm. More specifically, chamber parts such as pedestal, gas box, edge ring, showerhead, face plate and selective modulating device (SMD) are directly or indirectly in contact with plasma where all the reactant species such as H*, F*, O*, NO* are present. Thus, utilizing coating layer 208 with relatively denser film structure, as discussed herein, may provide a surface protection of the chamber parts to prevent reactive fluoride ions/radicals from attacking the chamber parts. It is believed that surface 206 of the outer layer 205 may be easily saturated by the F*, O*, N* ions, forming yttrium-fluoride ($YF_3$) or yttrium-oxy-fluoride (YOF) which is relatively inert to the reactive plasma so it allows all other efficient radicals to reach to the production substrate for selective etching, rather than overly attacking the chamber component.

In one embodiment, the coating layer 208 may have a film density between about 3.5 $g/cm^3$ and 5 $g/cm^3$. The coating layer 208 has a pore density less than 13 percent. The coating layer 208 may have an average pore size less than 50 nm.

The coating layer 208 may have a surface finish roughness (Ra) of between about 100 micro-inches and about 270 micro-inches. The chamber component may include a coating layer that provides a fluorine-rich surface. For example, the coating layer 208 may have a ratio of fluorine (F) element to yttrium (Y) element to oxygen element (O) of between 4.5:2:2 (e.g., F:O:Y=4.5:2:2). More specifically, the coating layer 208 may have a ratio of the fluorine (F) element to the yttrium (Y) element of between about 1:4 and about 4:1, such as about 2:1. The coating layer 208 may have a ratio of the fluorine (F) element to the oxygen (O) element of between about 1:5 and about 5:1, such as about 2:1. The coating layer 208 may have a ratio of the oxygen (O) element to the yttrium (Y) element of between about 1:3 and about 3:1, such as about 1:1. The coating layer 208 may be formed amorphous or crystalline in nature.

A chamber component 200 produced by the method 100 having coating layer formed from a wet coating solution as described above can advantageously maintain a significantly longer plasma exposure before penetration into the outer layer 205 or even the body 204 of the chamber component 200 and produces little to no physical particles or flakes. Moreover, with the coating layer 208 formed from the wet coating solution with proper/controlled fluorine ion concentration and desired pH level, the characteristics and detects sourced from the yttria containing chamber component 200 with respect to intermetallics, surface defects, and internal structure becomes significantly less as compared to uncoated components.

The chamber component 200 with the coating layer 208 formed thereon depicted in FIG. 2B may be used within a processing chamber, which as a processing chamber 400 of FIG. 4, which will be described in further detail below. Although the chamber component 200 is shown in FIG. 2A as having a rectangular cross-section (cut along the cutaway line A-A' of the chamber component 200 depicted in FIG. 3) for the purposes of discussion, it is understood that the chamber component 200 may take the form of any chamber part, including, but not limited to, a chamber body, a chamber body upper liner, a chamber body lower liner, chamber body plasma door, a cathode liner, a chamber lid gas ring, a throttling gate valve spool, a plasma screen, a pedestal, a substrate support assembly, a gas distribution plate, a showerhead, a gas nozzle, and the like.

FIG. 3 depicts a schematic cross-sectional view of the wet processing tool 300 in which the wet coating process may be performed. The wet processing tool 300 generally include the tank 302 having an interior volume that may contain the wet coating solution 304, such as described with reference to operation 104. It is noted that other suitable liquid, fluid, bath or the like, may also be used in the tank 302 to perform the wet coating process. The tank 302 may have a rack 308 (or a supporting structure) disposed therein to support a plurality of or a chamber component, such as the chamber component 200, for processing. Alternatively, the chamber component 200 may be secured or positioned in the tank 302 another suitable manner, such as inserted and supported within a cassette, which may hold and secure one or more chamber components 200 at desired positions. It is noted that the tank 302 may also be utilized to perform wet coating process for a single chamber component as needed.

The chamber component 200 are immersed, flooded, placed, wetted, processed, sprayed or otherwise wetted in the wet coating solution 304 disposed in the tank 302 for processing. The tank 302 may include a first supply source 312 and a second supply source 314 that may supply processing liquid or processing solution into the tank 302 through an inlet port 310. In one embodiment, the first supply source 312 may supply deionized (DI) water into the tank 302 and the second supply source 314 may supply reactive chemicals, such as HF and/or ammonium salt, into the tank 302.

Alternatively, the second supply source 314 may also supply other suitable solution elements, such as a dilution of $NH_4F/H_2O$, dilution of $HF/H_2O$, or solution of Ethylene Glycol/$H_2O$, into the tank 302 to perform the wet coating process. It is noted that additional supply sources may be coupled to the tank 302 to supply different chemicals to the wet coating solution 304 as needed. In one exemplary embodiment depicted herein, the reactive chemicals supplied from the second supply source 314 are HF, $NH_4F$ and Ethylene Glycol in DI water ($H_2O$) and they may be continuously bubbled or supplied into the tank 302, mixing with the deionized (DI) water supplied from the first supply source 312 to form the wet coating solution 304 in the tank 302 for performing the wet coating process on the chamber component 200 immersed in the tank 302.

Figure 4:
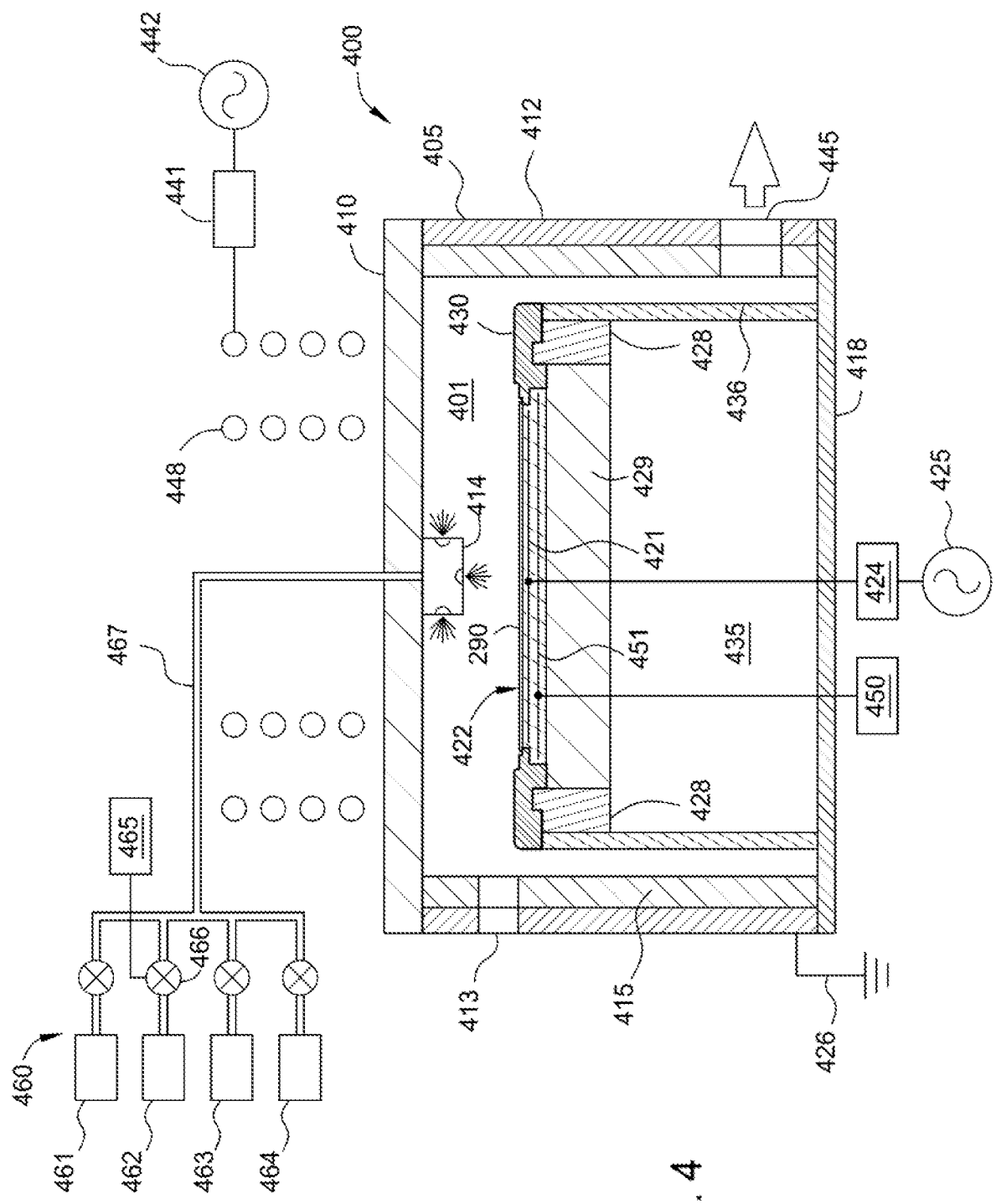
FIG. 4 illustrates a sectional view of an etch processing chamber having a coated chamber component having a coating according to one embodiment of the disclosure.

FIG. 4 is a simplified cutaway view of an exemplary etch processing chamber 400 that may be utilized to perform an etching process utilizing the chamber component 200 having the coating layer 208. The exemplary etch processing chamber 400 is suitable for removing one or more film layers from a substrate 290. One example of the etch processing chamber 400 that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The etch processing chamber 400 includes a chamber body 405 having a chamber volume 401 defined therein. The chamber body 405 has sidewalls 412 and a bottom 418 which are coupled to ground 426. The sidewalls 412 have a liner 415 to protect the sidewalls 412 and extend the time between maintenance cycles of the etch processing chamber 400. The dimensions of the chamber body 405 and related components of the etch processing chamber 400 are not limited and generally are proportionally larger than the size of the substrate 290 to be processed therein. Examples of substrate sizes include 200 mm diameter, 250 mm diameter, 300 mm diameter and 450 mm diameter, among others.

The chamber body 405 supports a chamber lid assembly 410 to enclose the chamber volume 401. The chamber body 405 may be fabricated from aluminum, yttria ($Y_2O_3$), yttrium containing materials or other suitable materials.

A substrate access port 413 is formed through the sidewall 412 of the chamber body 405, facilitating the transfer of the substrate 290 into and out of the etch processing chamber 400. The access port 413 may be coupled to a transfer chamber and/or other chambers of a substrate processing system (not shown).

A pumping port 445 is formed through the sidewall 412 of the chamber body 405 and connected to the chamber volume 401. A pumping device (not shown) is coupled through the pumping port 445 to the chamber volume 401 to evacuate and control the pressure therein. The pumping device may include one or more pumps and throttle valves.

A gas panel 460 is coupled by a gas line 467 to the chamber body 405 to supply process gases into the chamber volume 401. The gas panel 460 may include one or more process gas sources 461, 462, 463, 464 and may additionally include inert gases, non-reactive gases, and reactive gases, if desired. Examples of process gases that may be provided by the gas panel 460 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), and oxygen gas ($O_2$). Additionally, process gasses may include chlorine, fluorine, oxygen and hydrogen containing gases such as $BCl_3$, $C_4F_8$, $C_4F_6$, $CHF_3$, $CH_2F_2$, $CH_3F$, $NF_3$, $CO_2$, $SO_2$, CO, and $H_2$ among others.

Valves 466 control the flow of the process gases from the sources 461, 462, 463, 464 from the gas panel 460 and are managed by a controller 465. The flow of the gases supplied to the chamber body 405 from the gas panel 460 may include combinations of the gases.

The lid assembly 410 may include a nozzle 414. The nozzle 414 has one or more ports for introducing the process gases from the sources 461, 462, 464, 463 of the gas panel 460 into the chamber volume 401. After the process gases are introduced into the etch processing chamber 400, the gases are energized to form plasma. An antenna 448, such as one or more inductor coils, may be provided adjacent to the etch processing chamber 400. An antenna power supply 442 may power the antenna 448 through a match circuit 441 to inductively couple energy, such as RF energy, to the process gas to maintain a plasma formed from the process gas in the chamber volume 401 of the etch processing chamber 400. Alternatively, or in addition to the antenna power supply 442, process electrodes below the substrate 290 and/or above the substrate 290 may be used to capacitively couple RF power to the process gases to maintain the plasma within the chamber volume 401. The operation of the power supply 442 may be controlled by a controller, such as controller 465, that also controls the operation of other components in the etch processing chamber 400.

A substrate support pedestal 435 is disposed in the chamber volume 401 to support the substrate 290 during processing. The support pedestal 435 may include an electro-static chuck (ESC) 422 for holding the substrate 290 during processing. The electro-static chuck (ESC) 422 uses the electro-static attraction to hold the substrate 290 to the substrate support pedestal 435. The ESC 422 is powered by an RF power supply 425 integrated with a match circuit 424. The ESC 422 comprises an electrode 421 embedded within a dielectric body. The RF power supply 425 may provide a RF chucking voltage of about 200 volts to about 2000 volts to the electrode 421. The RF power supply 425 may also include a system controller for controlling the operation of the electrode 421 by directing a DC current to the electrode 421 for chucking and de-chucking the substrate 290.

The ESC 422 may also include an electrode 451 deposed therein. The electrode 451 is coupled to a power source 450 and provides a bias which attracts plasma ions, formed by the process gases in the chamber volume 401, to the ESC 422 and substrate 290 positioned thereon. The power source 450 may cycle on and off, or pulse, during processing of the substrate 290. The ESC 422 has an isolator 428 for the purpose of making the sidewall of the ESC 422 less attractive to the plasma to prolong the maintenance life cycle of the ESC 422. Additionally, the substrate support pedestal 435 may have a cathode liner 436 to protect the sidewalls of the substrate support pedestal 435 from the plasma gases and to extend the time between maintenance of the plasma etch processing chamber 400.

The ESC 422 may include heaters disposed therein and connected to a power source (not shown), for heating the substrate, while a cooling base 429 supporting the ESC 422 may include conduits for circulating a heat transfer fluid to maintain a temperature of the ESC 422 and the substrate 290 disposed thereon. The ESC 422 is configured to perform in the temperature range required by the thermal budget of the device being fabricated on the substrate 290. For example, the ESC 422 may be configured to maintain the substrate 290 at a temperature of about minus about 25 degrees Celsius to about 500 degrees Celsius for certain embodiments.

The cooling base 429 is provided to assist in controlling the temperature of the substrate 290. To mitigate process drift and time, the temperature of the substrate 290 may be maintained substantially constant by the cooling base 429 throughout the time the substrate 290 is in the etch chamber 400. In one embodiment, the temperature of the substrate 290 is maintained throughout subsequent etch processes at about 70 to 90 degrees Celsius.

A cover ring 430 is disposed on the ESC 422 and along the periphery of the substrate support pedestal 435. The cover ring 430 is configured to confine etching gases to a desired portion of the exposed top surface of the substrate 290, while shielding the top surface of the substrate support pedestal 435 from the plasma environment inside the etch processing chamber 400. Lift pins (not shown) are selectively moved through the substrate support pedestal 435 to lift the substrate 290 above the substrate support pedestal 435 to facilitate access to the substrate 290 by a transfer robot (not shown) or other suitable transfer mechanism.

The controller 465 may be utilized to control the process sequence, regulating the gas flows from the gas panel 460 into the etch processing chamber 400 and other process parameters. Software routines, when executed by the CPU, transform the CPU into a specific purpose computer (controller) that controls the etch processing chamber 400 such that the processes are performed in accordance with the present invention. The software routines may also be stored and/or executed by a second controller (not shown) that is collocated with the etch processing chamber 400.

The substrate 290 has various film layers disposed thereon which may include at least one metal layer. The various film layers may require etch recipes which are unique for the different compositions of the other film layers in the substrate 290. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 400 is configured to at least etch a metal layer or dielectric layer to form a semiconductor device. For processing parameters provided herein, the etch processing chamber 400 is configured to process a 300 diameter substrate, i.e., a substrate having a plan area of about 0.0707 m$^2$. The process parameters, such as flow and power, may generally be scaled proportionally with the change in the chamber volume or substrate plan area.

It is noted that the chamber component 200 is shown in FIG. 2A may be in any form utilized as any chamber part, including, but not limited to, a chamber body 405, a chamber body liner 415 (including upper or lower liner), substrate access port 413, the ESC 422, the cover ring 430 (including a chamber lid gas ring), lid assembly 410, a gas nozzle 414, and the like including any suitable chamber components included in the etch processing chamber 400.

With the example and explanations above, the features and spirits of the embodiments of the disclosure are described. Those skilled in the art will readily observe that numerous modifications and alterations of the device may be made while retaining the teaching of the disclosure. Accordingly, the above disclosure should be construed as limited only by the metes and bounds of the appended claims.

The claims are as follows:

1. A chamber component, for use in a plasma processing apparatus, comprising:
   a body having an outer layer comprising yttria; and
   a coating layer formed directly on the outer layer, wherein the coating layer comprises yttrium-oxy-fluoride, wherein the coating layer comprising the yttrium-oxy-fluoride has an average pore size greater than 0 nm and less than 50 nm.

2. The chamber component of claim 1, wherein the coating layer has a thickness of between about 10 nm and about 80 nm.

3. The chamber component of claim 1, wherein the coating layer has a film density of between about 3.5 g/cm$^3$ and about 5 g/cm$^3$.

4. The chamber component of claim 1, wherein the coating layer has a ratio of fluoride (F) elements to yttrium (Y) to oxygen elements (O) of about 4.5:2:2.

5. The chamber component of claim 1, wherein the coating layer has a ratio of fluorine (F) elements to yttrium (Y) elements of between about 1:4 and about 4:1.

6. The chamber component of claim 1, wherein the coating layer has a ratio of fluorine (F) elements to oxygen (O) elements of between about 1:5 and about 5:1.

7. The chamber component of claim 1, wherein the coating layer is formed from a wet coating solution comprising at least one fluorine containing chemical and ammonium salt.

8. The chamber component of claim 7, wherein the ammonium salt is selected from a group consisting of ammonium fluoride ($NH_4F$), ammonium chloride ($NH_4Cl$), ammonium nitrate ($NH_4NO_3$), ammonium hydrogen difluoride ($NH_4HF_2$), ammonium tetrafluoroborate ($NH_4BF_4$) and ammonium hexafluorosilicate (($NH_4)_2SiF_6$).

9. The chamber component of claim 7, wherein the fluorine containing chemical is HF or buffered HF.

10. The chamber component of claim 7, wherein the wet coating solution further comprises a buffer agent.

11. The chamber component of claim 10, wherein the buffer agent is ethylene glycol, $HNO_3$, or toluene.

12. The chamber component of claim 7, wherein the wet coating solution has a solution temperature around room temperature.

13. The chamber component of claim 7, wherein the wet coating solution has a pH value between 2 and 6.

14. The chamber component of claim 1, wherein the coating layer has a ratio of fluoride (F) elements to oxygen elements (O) of about 4.5:2.

15. An apparatus for use in a plasma processing chamber having a chamber component disposed therein,
the chamber component disposed in the plasma processing chamber, wherein the chamber component comprises:
a body having an outer layer comprising yttria; and
a coating layer formed on the body, wherein the coating layer comprises yttrium-oxy-fluoride, wherein the yttrium-oxy-fluoride is formed directly on an outer surface of the outer layer of the body, wherein the coating layer has a film density of between about 3.5 g/cm$^3$ and about 5 g/cm$^3$, wherein the coating layer comprising the yttrium-oxy-fluoride has an average pore size greater than 0 nm and less than 50 nm.

16. The apparatus of claim 15, wherein the coating layer has a ratio of fluorine (F) elements to yttrium (Y) elements to oxygen element (O) of about 4.5:2:2.

17. The apparatus of claim 15, wherein the coating layer is formed from a wet coating solution comprises at least one fluorine containing chemical and ammonium salt.

18. The apparatus of claim 17, wherein the fluorine containing chemical is HF or buffered HF and the ammonium salt is NH$_4$F.

19. The apparatus of claim 15, wherein the coating layer has a ratio of fluoride (F) elements to oxygen elements (O) of about 4.5:2.

20. A chamber component, for use in a plasma processing apparatus, comprising:
a body having an outer layer comprising yttria; and
a coating layer formed directly on the outer layer, wherein the coating layer comprises yttrium-oxy-fluoride, wherein the coating layer comprising the yttrium-oxy-fluoride has an average pore size greater than 0 nm and less than 50 nm, wherein the coating layer comprising the yttrium-oxy-fluoride comprises a surface finish roughness (Ra) of about 100 micro-inches too about 270 micro-inches.

* * * * *